United States Patent
Choi et al.

(10) Patent No.: US 8,466,567 B2
(45) Date of Patent: Jun. 18, 2013

(54) INTEGRATED CIRCUIT PACKAGING SYSTEM WITH STACK INTERCONNECT AND METHOD OF MANUFACTURE THEREOF

(75) Inventors: DaeSik Choi, Seoul (KR); SangMi Park, Pucheon Si (KR); Oh Han Kim, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 287 days.

(21) Appl. No.: 12/884,134

(22) Filed: Sep. 16, 2010

(65) Prior Publication Data

US 2012/0068319 A1   Mar. 22, 2012

(51) Int. Cl.
*H01L 23/28* (2006.01)

(52) U.S. Cl.
USPC ............ 257/787; 257/778; 257/686; 257/784

(58) Field of Classification Search
USPC ................. 257/686, 777, 723, 724, 787, 778, 257/784, 786
See application file for complete search history.

(56) References Cited

U.S. PATENT DOCUMENTS

| | | | |
|---|---|---|---|
| 7,345,361 B2 | 3/2008 | Mallik et al. | |
| 7,535,086 B2 | 5/2009 | Merilo et al. | |
| 7,642,133 B2 | 1/2010 | Wu et al. | |
| 7,714,453 B2 | 5/2010 | Khan et al. | |
| 7,923,290 B2 * | 4/2011 | Ko et al. | 438/106 |
| 7,994,626 B2 * | 8/2011 | Pendse | 257/686 |
| 8,063,475 B2 * | 11/2011 | Choi et al. | 257/686 |
| 8,174,119 B2 * | 5/2012 | Pendse | 257/738 |
| 8,217,502 B2 * | 7/2012 | Ko | 257/686 |
| 8,241,955 B2 * | 8/2012 | Pagaila et al. | 438/108 |
| 2008/0073769 A1 | 3/2008 | Wu et al. | |
| 2008/0136003 A1 * | 6/2008 | Pendse | 257/686 |
| 2008/0258289 A1 | 10/2008 | Pendse et al. | |
| 2010/0019360 A1 | 1/2010 | Khan et al. | |
| 2011/0068468 A1 * | 3/2011 | Lin et al. | 257/737 |
| 2011/0186994 A1 * | 8/2011 | Ko et al. | 257/737 |

* cited by examiner

*Primary Examiner* — S. V Clark
(74) *Attorney, Agent, or Firm* — Ishimaru & Associates LLP; I-Chang John Yang

(57) ABSTRACT

A method of manufacture of an integrated circuit packaging system includes: forming a connection carrier having base device pads and base interconnect pads on a carrier top side of the connection carrier; connecting a base integrated circuit to the base device pads and mounted over the carrier top side; mounting base vertical interconnects directly on the base interconnect pads; attaching a base package substrate to the base integrated circuit and directly on the base vertical interconnects; forming a base encapsulation on the base package substrate, the base device pads, and the base interconnect pads; and removing a portion of the connection carrier with the base device pads and the base interconnect pads partially exposed opposite the base package substrate.

14 Claims, 5 Drawing Sheets

US 8,466,567 B2

INTEGRATED CIRCUIT PACKAGING SYSTEM WITH STACK INTERCONNECT AND METHOD OF MANUFACTURE THEREOF

TECHNICAL FIELD

The present invention relates generally to an integrated circuit packaging system, and more particularly to a system for stacking integrated circuit packages.

BACKGROUND ART

The electronic industry continues to seek products that are lighter, faster, smaller, multi-functional, more reliable, and more cost-effective. The advent of multi-function electronic devices, such as cell phones that are also game platforms, cameras, Internet portals, and music or video players, has brought immense pressure on the electronics device manufacturers and the manufacturing companies that support them.

In an effort to meet such requirements, package assembly techniques have been developed for multi-chip packages (MCP) and chip stack packages. These types of packages combine two or more semiconductor chips in a single package, thereby realizing increased memory density, multi-functionality, and/or reduced package footprint.

However, the use of several chips in a single package does tend to reduce both reliability and yield. During post assembly testing, if just one chip in the multi-chip or chip stack package fails to meet the functional or performance specifications, the entire package fails, causing the good chip(s) to be discarded along with the failing chip. As a result, multi-chip and chip stack packages tend to lower the productivity from the assembly process.

Thus, a need still remains for an integrated circuit packaging system with smaller size, more functionality, and improved reliability. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a connection carrier having base device pads and base interconnect pads on a carrier top side of the connection carrier; connecting a base integrated circuit to the base device pads and mounted over the carrier top side; mounting base vertical interconnects directly on the base interconnect pads; attaching a base package substrate to the base integrated circuit and directly on the base vertical interconnects; forming a base encapsulation on the base package substrate, the base device pads, and the base interconnect pads; and removing a portion of the connection carrier with the base device pads and the base interconnect pads partially exposed opposite the base package substrate.

The present invention provides an integrated circuit packaging system, including: base device pads having device pad surfaces coplanar to each other characteristic of being formed on a carrier top side of a connection carrier; base interconnect pads having interconnect pad surfaces coplanar to each other characteristic of being formed on the carrier top side; a base integrated circuit connected to the base device pads; base vertical interconnects mounted directly on the base interconnect pads; a base package substrate attached to the base integrated circuit and directly on the base vertical interconnects; and a base encapsulation on the base package substrate, the base device pads, and the base interconnect pads, the base encapsulation partially exposing the base device pads and the base interconnect pads opposite the base package substrate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
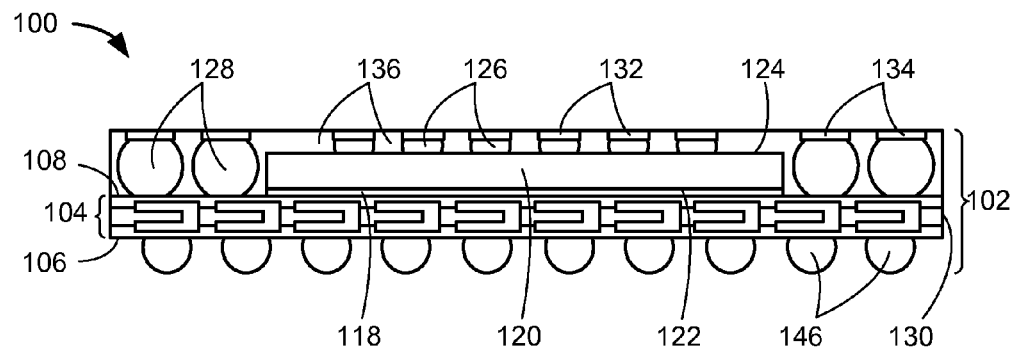
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Three-dimensional (3D) package technology, such package-on-package (POP), package-in-package (PiP), or fan-in package-on-package (FiPOP), is important in packaging. In a package-on-package (POP) package of a three-dimensional (3D) package structure, there is a concern with package warpage. Exposed solder-on-pad (eSOP) is developed to prevent warpage. However, a problem of no joint of solder bumps occurs with exposed solder-on-pad (eSOP) between top and bottom solder bumps due to narrow contact areas. A general package-on-package bottom (PoPb) exposed solder-on-pad (eSOP) package (PoPb-eSOP) package can have problems with narrow contact areas.

Recent packaging development, such as a molded laser package-on-package (MLP) packaging system or a half-cut packaging system, prevents warpage and improves joints of solder bumps. However, this development method has reliability problems (e.g., snowballs or opens) due to a solder bump volume difference between top and bottom solder bumps or an irregular half-cutting formation at bottom portions of solder balls. A package-on-package bottom (PoPb) molded laser package-on-package (MLP) 0.5P package (PoPb-MLP) can have problems of taking a long time for laser ablation or narrow inner holes. A package-on-package bottom (PoPb) exposed solder-on-pad (eSOP) package (PoPb-eSOP) with a half-cutting method can have problems with snow ball/bump cracks due to solder bump volume difference. Embodiments of the present invention provide answers or solutions to these problems.

Figure 2:
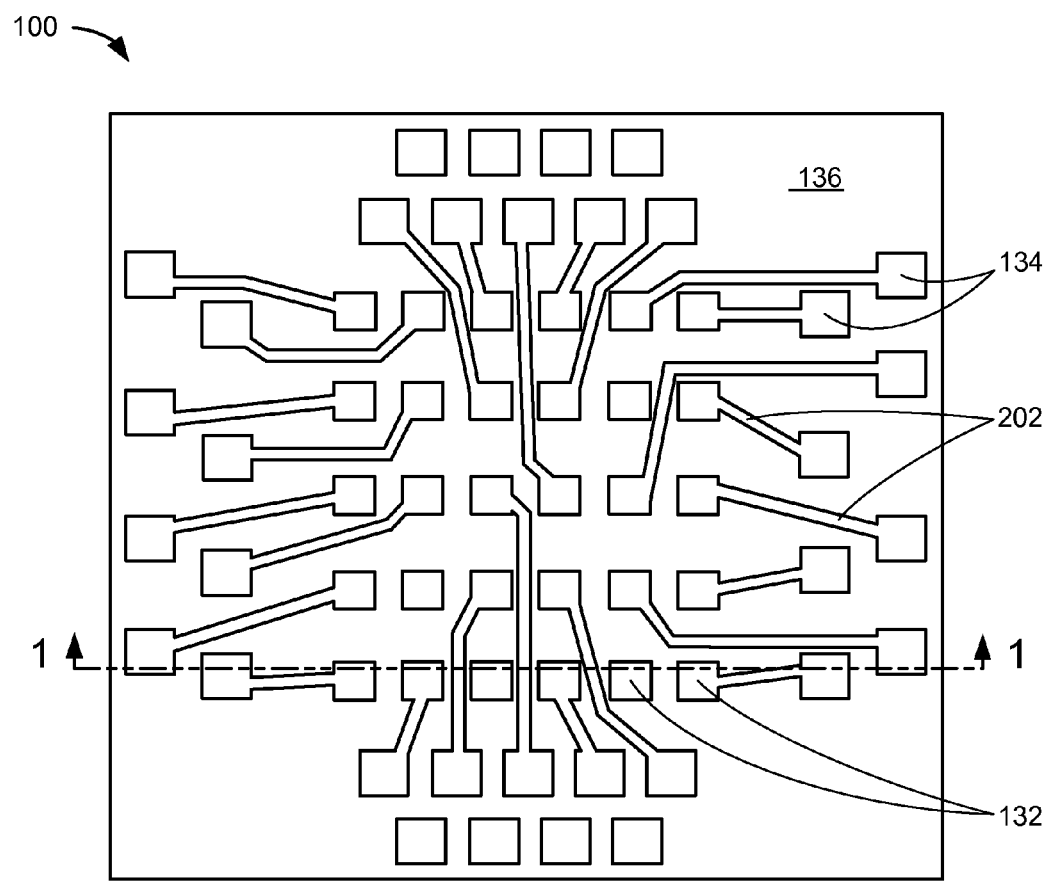
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include an exposed solder-on-pad (eSOP) structure formed with an etched leadframe. The integrated circuit packaging system 100 can include a base package 102, which is a semiconductor package.

The base package 102 can include a base package substrate 104, which is a support structure for mounting and electrically connecting a semiconductor device thereto. The base package substrate 104 can include a base substrate bottom side 106 and a base substrate top side 108 opposite the base substrate bottom side 106. The base package substrate 104 can be electrically connected between the base substrate bottom side 106 and the base substrate top side 108.

The base package 102 can include a base attach layer 118 attached to a base integrated circuit 120 and the base substrate top side 108. The base attach layer 118 can include an attach material including a die attach material, an adhesive, or an epoxy. The base integrated circuit 120 is a semiconductor device including a flip chip or an integrated circuit die. For illustrative purposes, the base integrated circuit 120 is shown as a flip chip, although it is understood that the base integrated circuit 120 can be any semiconductor device.

The base integrated circuit 120 can be mounted over a central portion of the base substrate top side 108. The base integrated circuit 120 can include a base device inactive side 122 and a base device active side 124 opposite the base device inactive side 122. The base device inactive side 122 can be attached to the base substrate top side 108 with the base attach layer 118.

The base package 102 can include base device connectors 126 attached to the base device active side 124. The base device connectors 126 provide electrical connectivity between the base integrated circuit 120 and a semiconductor component (not shown) that can be mounted thereon. The base device connectors 126 can be formed in an area array at a central portion of the base device active side 124. For illustrative purposes, the base device connectors 126 are shown as conductive bumps, although it is understood that the base device connectors 126 can be any other electrical connectors.

The base package 102 can include base vertical interconnects 128 connected to the base substrate top side 108. The base vertical interconnects 128 provide electrical connectivity between the base package substrate 104 and a semiconductor component (not shown) that can be mounted thereon. The base vertical interconnects 128 can be adjacent the base integrated circuit 120. Top ends of the base vertical interconnects 128 can be above the base device active side 124.

The base vertical interconnects 128 can include a height that can be greater than a combined height of the base attach layer 118 and the base integrated circuit 120. In other words, a distance from the base substrate top side 108 to top ends of the base vertical interconnects 128 can be greater than a distance from the base substrate top side 108 to the base device active side 124.

The base vertical interconnects 128 can be formed in a peripheral array adjacent and within a base substrate periphery 130 of the base package substrate 104. The base vertical interconnects 128 can be between the base integrated circuit 120 and the base substrate periphery 130.

The base package 102 can include base device pads 132 directly on the base device connectors 126. The base device pads 132 are contact pads that provide electrical connectivity between the base integrated circuit 120 and a semiconductor component (not shown) that can be mounted thereon.

The base device connectors 126 can be connected to the base integrated circuit 120 and the base device pads 132. The base device pads 132 can provide electrical connectivity to the base integrated circuit 120 through the base device connectors 126.

The base package 102 can include base interconnect pads 134 directly on the base vertical interconnects 128. The base interconnect pads 134 are contact pads that provide electrical connectivity between the base package substrate 104 and a semiconductor component (not shown) that can be mounted thereon. The base interconnect pads 134 can provide electrical connectivity to the base package substrate 104 through the base vertical interconnects 128.

The base package 102 can include a base encapsulation 136, which covers a semiconductor package to seal electrical devices providing mechanical and environmental protection. The base encapsulation 136 can be formed over the base substrate top side 108. The base encapsulation 136 can cover the base attach layer 118, the base integrated circuit 120, the base device connectors 126, and the base vertical interconnects 128. The base encapsulation 136 can partially cover the base device pads 132 and the base interconnect pads 134.

The base package 102 can include base external interconnects 146 attached to the base substrate bottom side 106. The base external interconnects 146 are electrical connectors that provide electrical connectivity between the base package substrate 104 and external systems (not shown).

The base vertical interconnects 128 and the base interconnect pads 134 can include a combined height that is approximately equal to a combined height of the base attach layer 118, the base integrated circuit 120, the base device connectors 126, and the base device pads 132. In other words, a distance from the base substrate top side 108 to top surfaces of the base interconnect pads 134 can be approximately equal to a distance from the base substrate top side 108 to top surfaces of the base device pads 132.

The base vertical interconnects 128 can include a height that is approximately equal to a combined height of the base attach layer 118, the base integrated circuit 120, and the base device connectors 126. In other words, a distance from the base substrate top side 108 to top ends of the base vertical interconnects 128 can be approximately equal to a distance from the base substrate top side 108 to top ends of the base device connectors 126.

It has been discovered that the base device pads 132 connected to the base device connectors 126 and the base interconnect pads 134 connected to the base vertical interconnects 128 significantly enhance joint strength between top and bottom solder bumps in a package structure having an exposed solder-on-pad (eSOP).

Further, it has been discovered that the base device pads 132 and the base interconnect pads 134 provide improved reliability for top and bottom solder bump connections in a package structure having a package-on-package bottom (PoPb) package. The reliability is improved because surface areas of the base device pads 132 and the base interconnect pads have increased surface areas.

Yet further, it has been discovered that the base device pads 132 and the base interconnect pads 134 eliminate warpage thereby providing the base device pads 132 coplanar to each other, the base interconnect pads 134 coplanar to each other, or a combination thereof.

Referring now to FIG. 2, therein is shown a top view of the integrated circuit packaging system 100. The integrated circuit packaging system 100 can include the base device pads 132. The base device pads 132 can be formed in an area array with a number of rows. The base device pads 132 can be partially exposed from the base encapsulation 136. For illustrative purposes, the base device pads 132 are shown with a shape of a square, although it is understood that the base device pads 132 can have any shapes or sizes.

The integrated circuit packaging system 100 can include the base interconnect pads 134. The base interconnect pads 134 can be formed in a peripheral array with a number of rows. The base interconnect pads 134 can surround the base device pads 132. The base interconnect pads 134 can be formed in a staggered configuration. The base interconnect pads 134 can be partially exposed from the base encapsulation 136. For illustrative purposes, the base interconnect pads 134 are shown with a shape of a square, although it is understood that the base interconnect pads 134 can have any shapes or sizes.

The integrated circuit packaging system 100 can include conductive traces 202 connected to the base device pads 132 and the base interconnect pads 134. The conductive traces 202 provide electrical connections between the base device pads 132 and the base interconnect pads 134.

Figure 3:
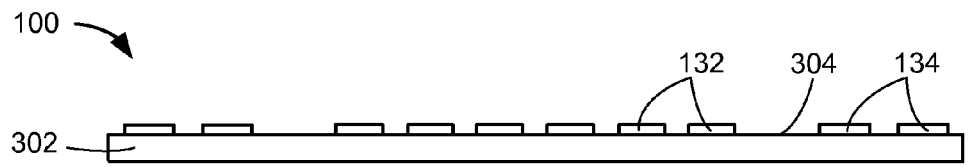
FIG. 3 is a cross-sectional view of the integrated circuit packaging system taken along line 1-1 of FIG. 2 in a carrier providing phase of manufacture.

Referring now to FIG. 3, therein is shown a cross-sectional view of the integrated circuit packaging system 100 taken along line 1-1 of FIG. 2 in a carrier providing phase of manufacture. The integrated circuit packaging system 100 can include a connection carrier 302, which provides a support structure for mounting or attaching a semiconductor device thereto.

The connection carrier 302 can be formed with a conductive material including copper (Cu). For illustrative purposes, the carrier providing phase is shown with the connection carrier 302, although it is understood that the carrier providing phase can include any other support structures including a leadframe.

The connection carrier 302 can include the base device pads 132 formed directly on a carrier top side 304 of the connection carrier 302. The base device pads 132 can be attached at a central portion of the connection carrier 302.

The connection carrier 302 can include the base interconnect pads 134 formed directly on the carrier top side 304. The base interconnect pads 134 can be attached adjacent the base device pads 132.

The connection carrier 302 can include the conductive traces 202 of FIG. 2 formed directly on the carrier top side 304 similar to the base device pads 132 or the base interconnect pads 134. The conductive traces 202 can be exposed by removing the connection carrier 302 in a subsequent phase. The conductive traces 202 can be connected to the base device pads 132 and the base interconnect pads 134. In an alternative embodiment, the conductive traces 202 can be part of the connection carrier 302 and formed by etching portions of the connection carrier 302.

If a thickness of the connection carrier 302 is too thin, the base device pads 132 and the base interconnect pads 134 can be designed to include a thickness that is thick so that the conductive traces 202 of FIG. 2 can have a good resistance. Thicknesses of the connection carrier 302, the base device pads 132, and the base interconnect pads 134 can be properly designed so that resistance of the conductive traces 202 can be good and cost can be controlled so not to increase in the mass production.

The thickness of the connection carrier 302 can be properly designed in view of thicknesses of the base device pads 132 and the base interconnect pads 134. The base device pads 132 and the base interconnect pads 134 can be properly designed in view of the thickness of the connection carrier 302.

The base device pads 132, the base interconnect pads 134, and the conductive traces 202 can preferably be formed of a common material. The connection carrier 302 can be formed with a material that is the same as or different from the material that is used to form the base device pads 132, the base interconnect pads 134, and the conductive traces 202.

Figure 4:
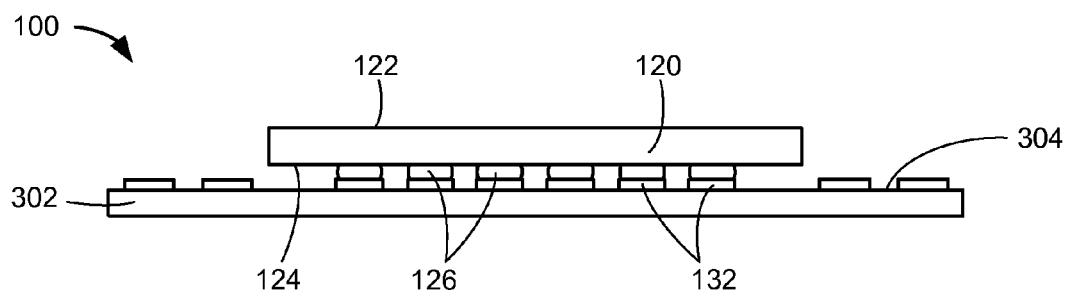
FIG. 4 is the structure of FIG. 3 in a device attaching phase.

Referring now to FIG. 4, therein is shown the structure of FIG. 3 in a device attaching phase. The integrated circuit packaging system 100 can include the base integrated circuit 120 having the base device inactive side 122 and the base device active side 124. The base integrated circuit 120 can be attached with the base device active side 124 facing the connection carrier 302. The base integrated circuit 120 can be mounted over the carrier top side 304.

The base device active side 124 can be connected to the base device pads 132 with the base device connectors 126. For illustrative purposes, the base device connectors 126 are shown as conductive bumps, although it is understood that the base device connectors 126 can be any other electrical connectors.

Figure 5:
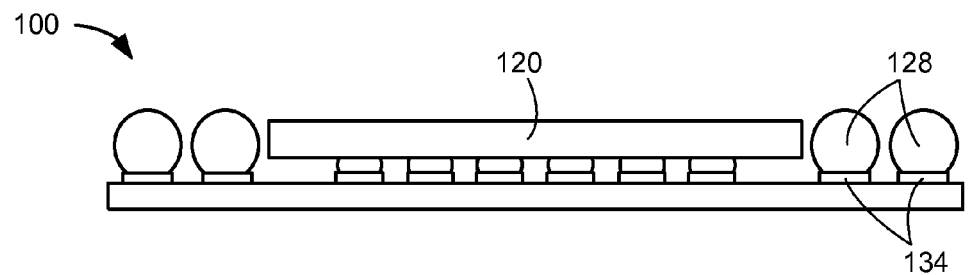
FIG. 5 is the structure of FIG. 4 in a connector attaching phase.

Referring now to FIG. 5, therein is shown the structure of FIG. 4 in a connector attaching phase. The integrated circuit packaging system 100 can include the base vertical interconnects 128 connected to the base interconnect pads 134. The base vertical interconnects 128 can be mounted directly on the base interconnect pads 134. The base vertical interconnects 128 can be adjacent the base integrated circuit 120.

The base vertical interconnects 128 can be attached at both sides of the base integrated circuit 120. For illustrative purposes, the base vertical interconnects 128 are shown as conductive bumps, although it is understood that the base vertical interconnects 128 can be any other electrical connectors.

Figure 6:
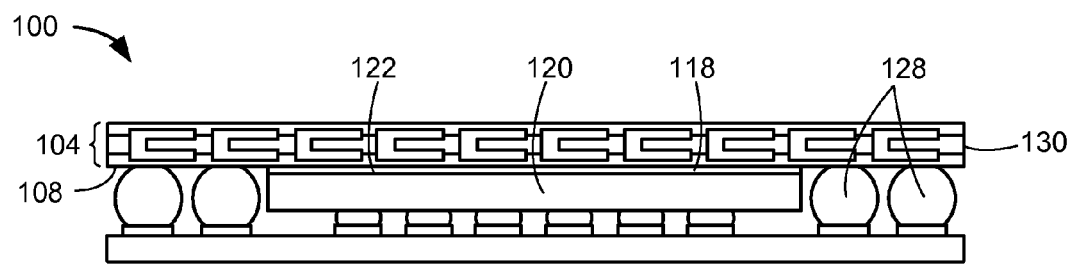
FIG. 6 is the structure of FIG. 5 in a substrate attaching phase.

Referring now to FIG. 6, therein is shown the structure of FIG. 5 in a substrate attaching phase. The integrated circuit packaging system 100 can include the base package substrate 104 attached to the base integrated circuit 120 and connected to the base vertical interconnects 128.

The integrated circuit packaging system 100 can include the base attach layer 118 attached to the base integrated circuit 120 and the base package substrate 104. The base attach layer 118 can be attached to the base device inactive side 122 and the base substrate top side 108.

The base vertical interconnects 128 can be connected to the base substrate top side 108. The base substrate top side 108 can be attached directly on the base vertical interconnects 128. The base vertical interconnects 128 can be between the base integrated circuit 120 and the base substrate periphery 130.

Figure 7:
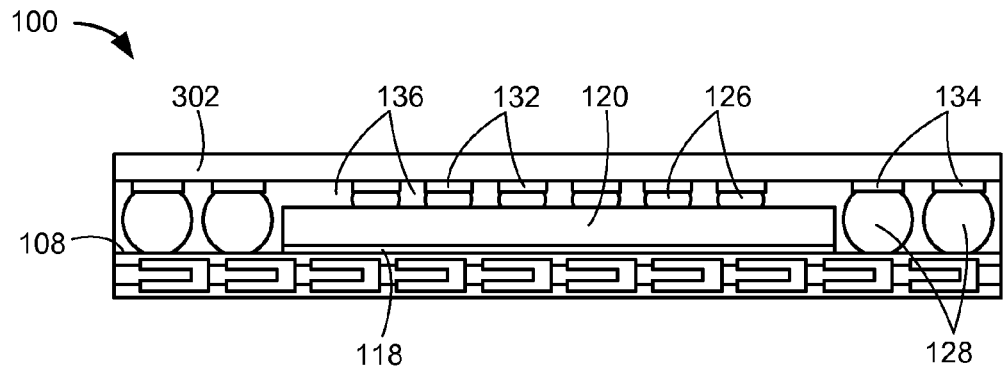
FIG. 7 is the structure of FIG. 6 in a molding phase.

Referring now to FIG. 7, therein is shown the structure of FIG. 6 in a molding phase. The molding phase is shown with the structure of FIG. 6 inverted.

The integrated circuit packaging system 100 can include the base encapsulation 136. The base encapsulation 136 can be a cover including an encapsulant, a mold material, or a mold compound. The base encapsulation 136 can be formed over the base substrate top side 108. The base encapsulation 136 can be formed in a space between the base substrate top side 108 and the connection carrier 302.

The base encapsulation 136 can be formed on the base substrate top side 108, the base attach layer 118, the base integrated circuit 120, the base device connectors 126, and the base vertical interconnects 128. The base encapsulation 136 can also be formed on the base device pads 132 and the base interconnect pads 134.

The base encapsulation 136 can cover the base attach layer 118, the base integrated circuit 120, the base device connectors 126, and the base vertical interconnects 128. The base encapsulation 136 can partially cover the base device pads 132 and the base interconnect pads 134.

Figure 8:
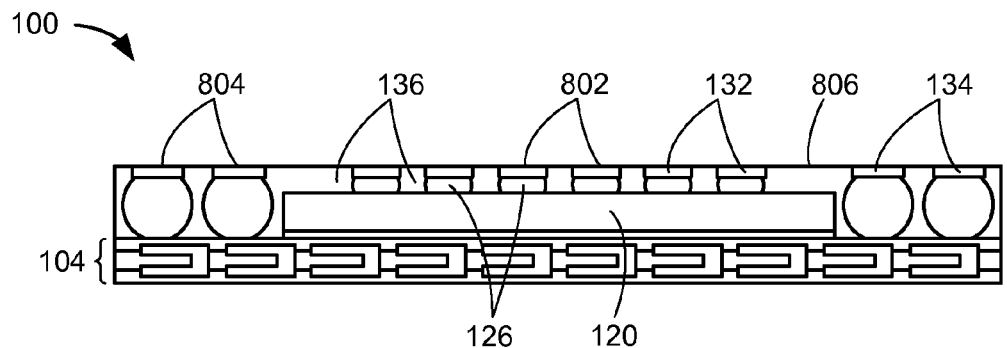
FIG. 8 is the structure of FIG. 7 in a removal phase.

Referring now to FIG. 8, therein is shown the structure of FIG. 7 in a removal phase. The removal phase can include a chemical or mechanical removal process including etching or grinding to remove a portion of the connection carrier 302 of FIG. 7.

The base device pads 132 and the base interconnect pads 134 can be partially exposed from the base encapsulation 136. Device pad surfaces 802 of the base device pads 132 and interconnect pad surfaces 804 of the base interconnect pads 134 can be exposed from the base encapsulation 136. The device pad surfaces 802 and the interconnect pad surfaces 804 are top surfaces of the base device pads 132 and the base interconnect pads 134, respectively.

The device pad surfaces 802 and the interconnect pad surfaces 804 can be opposite and faced away from the base package substrate 104. The planes of portions of the device pad surfaces 802, the interconnect pad surfaces 804, or a combination thereof can be coplanar with a plane of a portion of an external planar surface 806 of the base encapsulation 136. The external planar surface 806 is a top surface of the base encapsulation 136.

The base device pads 132, the base interconnect pads 134, and the conductive traces 202 of FIG. 2 can include characteristics of being formed directly on the carrier top side 304 of FIG. 3 of the connection carrier 302 of FIG. 3. The characteristics of being formed directly on the carrier top side 304 can include planes of the device pad surfaces 802 coplanar to each other, planes of the interconnect pad surfaces 804 coplanar to each other, planes of top surfaces of the conductive traces 202 coplanar to each other, or a combination thereof. The characteristics can also include the device pad surfaces 802, the interconnect pad surfaces 804, and the top surfaces of the conductive traces 202 having etched marks, grinding marks, sanding marks, other removal marks, or chemical residue.

It has been discovered that the base device pads 132 and the base interconnect pads 134 formed directly on the connection carrier 302 of FIG. 3 eliminate warpage thereby providing the base device pads 132 coplanar to each other, the base interconnect pads 134 coplanar to each other, or a combination thereof.

Figure 9:
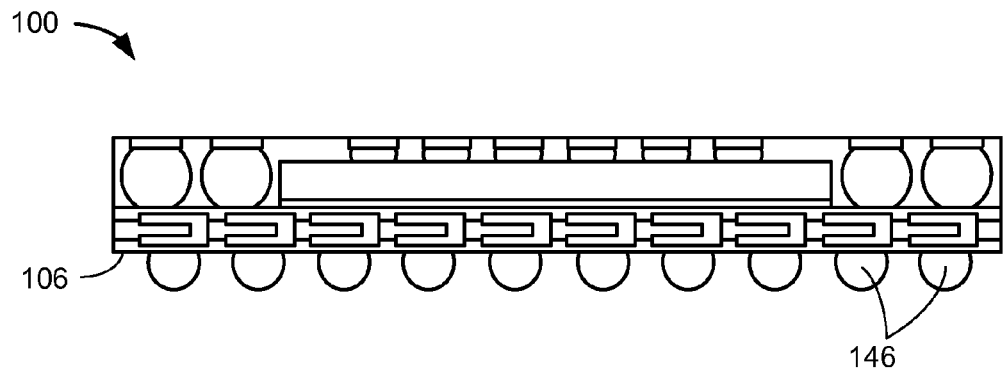
FIG. 9 is the structure of FIG. 8 in an interconnect attaching phase.

Referring now to FIG. 9, therein is shown the structure of FIG. 8 in an interconnect attaching phase. The integrated circuit packaging system 100 can include the base external interconnects 146 attached to the base substrate bottom side 106. For illustrative purposes, the base external interconnects 146 are shown as conductive bumps, although it is understood that the base external interconnects 146 can be any other electrical connectors.

Figure 10:
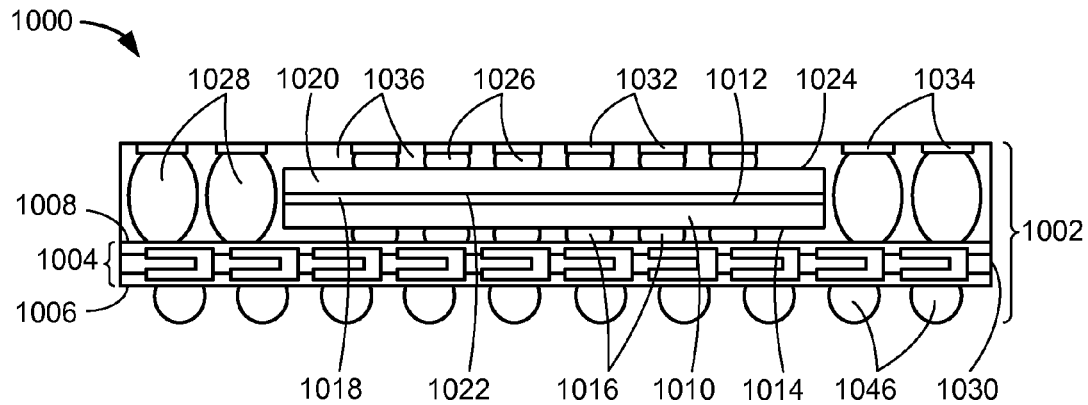
FIG. 10 is a cross-sectional view of an integrated circuit packaging system in a second embodiment of the present invention.

Referring now to FIG. 10, therein is shown a cross-sectional view of an integrated circuit packaging system 1000 in a second embodiment of the present invention. The integrated circuit packaging system 1000 can include a flip chip stack application.

The integrated circuit packaging system 1000 can be formed in a manner similar to the integrated circuit packaging system 100 of FIG. 1, except for the formation of the base attach layer 118 of FIG. 1. Further, the integrated circuit packaging system 1000 can be formed in a manner similar to the integrated circuit packaging system 100, except for additions of a semiconductor device and connectors.

The integrated circuit packaging system 1000 can include a base package 1002. The base package 1002 can include a base package substrate 1004 having a base substrate bottom side 1006 and a base substrate top side 1008. The base package substrate 1004 can be formed in a manner similar to the base package substrate 104 of FIG. 1.

The base package 1002 can include a base component 1010, which is a semiconductor device including a flip chip or an integrated circuit die. For illustrative purposes, the base component 1010 is shown as a flip chip, although it is understood that the base component 1010 can be any semiconductor device.

The base component 1010 can include a base component inactive side 1012 and a base component active side 1014 opposite the base component inactive side 1012. The base component 1010 can be mounted over the base package substrate 1004 with the base component active side 1014 facing the base substrate top side 1008.

The base package 1002 can include base component connectors 1016 connected to the base substrate top side 1008 and the base component active side 1014. The base component connectors 1016 provide electrical connectivity between the base package substrate 1004 and the base component 1010. For illustrative purposes, the base component connectors 1016 are shown as conductive bumps, although it is understood that the base component connectors 1016 can be any other electrical connectors.

The base package 1002 can include a base attach layer 1018 attached to the base component 1010 and a base integrated circuit 1020. The base attach layer 1018 can include an attach material including a die attach material, an adhesive, or an epoxy.

The base integrated circuit 1020 can include a base device inactive side 1022 and a base device active side 1024. The base integrated circuit 1020 can be attached to the base component 1010 with the base attach layer 1018 attached to the base component inactive side 1012 and the base device inactive side 1022. The base integrated circuit 1020 can be formed in a manner similar to the base integrated circuit 120 of FIG. 1.

The base integrated circuit 1020 can be attached to the base package substrate 1004. With the base attach layer 1018 attached to the base component inactive side 1012 and the base device inactive side 1022 and the base component connectors 1016 attached to the base substrate top side 1008 and the base component active side 1014, the base integrated circuit 1020 can be attached to the base package substrate 1004.

The base package 1002 can include base device connectors 1026 and base vertical interconnects 1028. The base device connectors 1026 and the base vertical interconnects 1028 can be formed in a manner similar to the base device connectors 126 of FIG. 1 and the base vertical interconnects 128 of FIG. 1, respectively.

The base vertical interconnects 1028 can include a height that is approximately equal to a combined height of the base component connectors 1016, the base component 1010, the base attach layer 1018, the base integrated circuit 1020, and the base device connectors 1026. In other words, a distance from the base substrate top side 1008 to top ends of the base vertical interconnects 1028 can be approximately equal to a distance from the base substrate top side 1008 to top ends of the base device connectors 1026.

The base package substrate 1004 can include a base substrate periphery 1030. The base package substrate 1004 can be formed in a manner similar to the base package substrate 104.

The base package 1002 can include base device pads 1032 and base interconnect pads 1034. The base device pads 1032 and the base interconnect pads 1034 can be formed in a manner similar to the base device pads 132 of FIG. 1 and the base interconnect pads 134 of FIG. 1, respectively.

The base package 1002 can include a base encapsulation 1036 and base external interconnects 1046. The base encapsulation 1036 and the base external interconnects 1046 can be formed in a manner similar to the base encapsulation 136 of FIG. 1 and the base external interconnects 146 of FIG. 1, respectively.

The base vertical interconnects 1028 and the base interconnect pads 1034 can include a combined height that is approximately equal to a combined height of the base component connectors 1016, the base component 1010, the base attach layer 1018, the base integrated circuit 1020, the base device connectors 1026, and the base device pads 1032. In other words, a distance from the base substrate top side 1008 to top surfaces of the base interconnect pads 1034 can be approximately equal to a distance from the base substrate top side 1008 to top surfaces of the base device pads 1032.

It has been discovered that the base device pads 1032 and the base interconnect pads 1034 significantly enhance joint strength between top and bottom solder bumps in a package structure with the base integrated circuit 1020 attached to the base component 1010.

Figure 11:
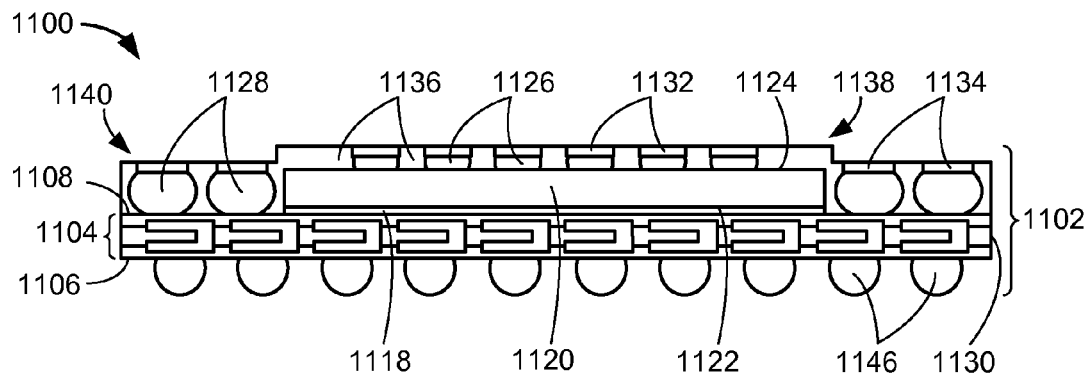
FIG. 11 is a cross-sectional view of an integrated circuit packaging system in a third embodiment of the present invention.

Referring now to FIG. 11, therein is shown a cross-sectional view of an integrated circuit packaging system 1100 in a third embodiment of the present invention. The integrated circuit packaging system 1100 can include a step leadframe application. The integrated circuit packaging system 1100 can be formed in a manner similar to the integrated circuit packaging system 100 of FIG. 1, except for the formation of the base vertical interconnects 128 of FIG. 1 and the base encapsulation 136 of FIG. 1.

The integrated circuit packaging system 1100 can include a base package 1102. The base package 1102 can include a base package substrate 1104 having a base substrate bottom side 1106 and a base substrate top side 1108. The base package substrate 1104 can be formed in a manner similar to the base package substrate 104 of FIG. 1.

The base package 1102 can include a base attach layer 1118. The base package 1102 can include a base integrated circuit 1120 having a base device inactive side 1122 and a base device active side 1124. The base package 1102 can include base device connectors 1126. The base attach layer 1118, the base integrated circuit 1120, and the base device connectors 1126 can be formed in a manner similar to the base attach layer 118 of FIG. 1, the base integrated circuit 120 of FIG. 1, and the base device connectors 126 of FIG. 1, respectively.

The base package 1102 can include base vertical interconnects 1128 connected to the base substrate top side 1108. The base vertical interconnects 1128 provide electrical connectivity between the base package substrate 1104 and a semiconductor component (not shown) that can be mounted thereon. The base vertical interconnects 1128 can be adjacent the base integrated circuit 1120. Top ends of the base vertical interconnects 1128 can be below the base device active side 1124.

The base vertical interconnects 1128 can include a height that can be less than a combined height of the base attach layer 1118 and the base integrated circuit 1120. In other words, a distance from the base substrate top side 1108 to the top ends of the base vertical interconnects 1128 can be less than a distance from the base substrate top side 1108 to the base device active side 1124.

The base vertical interconnects 1128 can be formed in a peripheral array adjacent and within a base substrate periphery 1130 of the base package substrate 1104. The base vertical interconnects 1128 can be between the base integrated circuit 1120 and the base substrate periphery 1130.

The base package 1102 can include base device pads 1132 and base interconnect pads 1134. The base device pads 1132 and the base interconnect pads 1134 can be formed in a manner similar to the base device pads 132 of FIG. 1 and the base interconnect pads 134 of FIG. 1, respectively. For illustrative purposes, the top ends of the base vertical interconnects 1128 are shown below the base device active side 1124, although it is understood that the top ends of the base vertical interconnects 1128 can be above the base device active side 1124 and below top ends of the base device pads 1132.

The base package 1102 can include a base encapsulation 1136, which covers a semiconductor package to seal electrical devices providing mechanical and environmental protection. The base encapsulation 1136 can be formed over the base substrate top side 1108.

The base encapsulation 1136 can cover the base attach layer 1118, the base integrated circuit 1120, the base device connectors 1126, and the base vertical interconnects 1128. The base encapsulation 1136 can partially cover the base device pads 1132 and the base interconnect pads 1134.

The base encapsulation 1136 can include a step portion 1138, which is a protrusion at a central portion of the base encapsulation 1136, aligned over the base integrated circuit 1120. The base encapsulation 1136 can partially expose the base device pads 1132 at the step portion 1138.

Top surfaces of the base device pads 1132 can be exposed from the base encapsulation 1136 at the step portion 1138. Planes of the top surfaces of the base device pads 1132 can be coplanar with a plane of a top surface of the step portion 1138.

The base encapsulation 1136 can include a peripheral portion 1140, which is adjacent and within a periphery of the base encapsulation 1136, aligned over the base vertical interconnects 1128 and adjacent the step portion 1138. The peripheral portion 1140 can be surrounding the step portion 1138. The base encapsulation 1136 can partially expose the base interconnect pads 1134 at the peripheral portion 1140.

Top surfaces of the base interconnect pads 1134 can be exposed from the base encapsulation 1136 at the peripheral portion 1140. Planes of the top surfaces of the base interconnect pads 1134 can be coplanar with a plane of a top surface of the peripheral portion 1140.

The peripheral portion 1140 can be adjacent sides of the step portion 1138. The peripheral portion 1140 can include a top surface that is lower than a top surface of the step portion 1138. The step portion 1138 can protrude from the peripheral portion 1140.

The base package 1102 can include base external interconnects 1146. The base external interconnects 1146 can be formed in a manner similar to the base external interconnects 146 of FIG. 1.

The base vertical interconnects 1128 and the base interconnect pads 1134 can include a combined height that is less than a combined height of the base attach layer 1118, the base integrated circuit 1120, the base device connectors 1126, and the base device pads 1132. In other words, a distance from the base substrate top side 1108 to the top surfaces of the base interconnect pads 1134 can be less than a distance from the base substrate top side 1108 to top surfaces of the base device pads 1132.

It has been discovered that the base device pads 1132 and the base interconnect pads 1134 significantly enhance joint strength between top and bottom solder bumps in a package structure with the base encapsulation 1136 having the step portion 1138 and the peripheral portion 1140.

Figure 12:
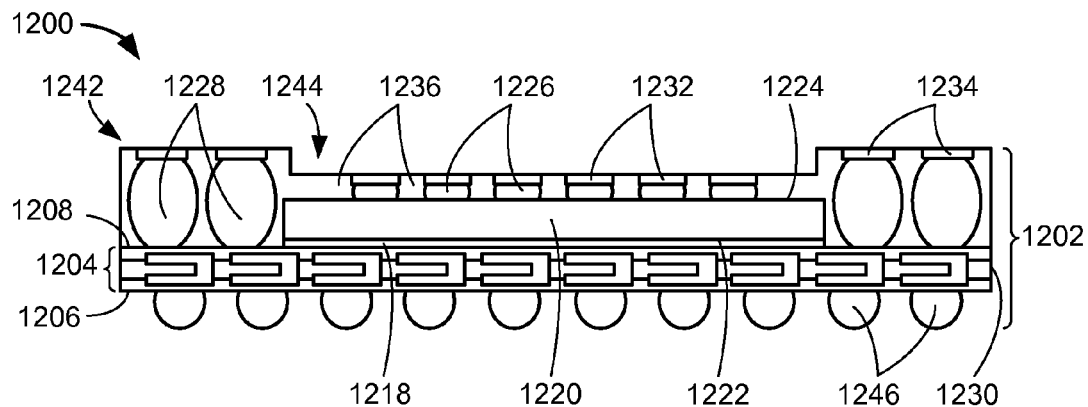
FIG. 12 is a cross-sectional view of an integrated circuit packaging system in a fourth embodiment of the present invention.

Referring now to FIG. 12, therein is shown a cross-sectional view of an integrated circuit packaging system 1200 in a fourth embodiment of the present invention. The integrated circuit packaging system 1200 can include a step leadframe application. The integrated circuit packaging system 1200 can be formed in a manner similar to the integrated circuit packaging system 100 of FIG. 1, except for the formation of the base vertical interconnects 128 of FIG. 1 and the base encapsulation 136 of FIG. 1.

The integrated circuit packaging system 1200 can include a base package 1202. The base package 1202 can include a base package substrate 1204 having a base substrate bottom side 1206 and a base substrate top side 1208. The base package substrate 1204 can be formed in a manner similar to the base package substrate 104 of FIG. 1.

The base package 1202 can include a base attach layer 1218. The base package 1202 can include a base integrated circuit 1220 having a base device inactive side 1222 and a base device active side 1224. The base package 1202 can include base device connectors 1226. The base attach layer 1218, the base integrated circuit 1220, and the base device connectors 1226 can be formed in a manner similar to the base attach layer 118 of FIG. 1, the base integrated circuit 120 of FIG. 1, and the base device connectors 126 of FIG. 1, respectively.

The base package 1202 can include base vertical interconnects 1228 connected to the base substrate top side 1208. The base vertical interconnects 1228 provide electrical connectivity between the base package substrate 1204 and a semiconductor component (not shown) that can be mounted thereon. The base vertical interconnects 1228 can be adjacent the base integrated circuit 1220. Top ends of the base vertical interconnects 1228 can be above the base device active side 1224 and the base device connectors 126.

The base vertical interconnects 1228 can be formed in a peripheral array adjacent and within a base substrate periphery 1230 of the base package substrate 1204. The base vertical interconnects 1228 can be between the base integrated circuit 1220 and the base substrate periphery 1230.

The base package 1202 can include base device pads 1232 and base interconnect pads 1234. The base device pads 1232 and the base interconnect pads 1234 can be formed in a manner similar to the base device pads 132 of FIG. 1 and the base interconnect pads 134 of FIG. 1, respectively.

The base package 1202 can include a base encapsulation 1236, which covers a semiconductor package to seal electrical devices providing mechanical and environmental protection. The base encapsulation 1236 can be formed over the base substrate top side 1208.

The base encapsulation 1236 can cover the base attach layer 1218, the base integrated circuit 1220, the base device connectors 1226, and the base vertical interconnects 1228. The base encapsulation 1236 can partially cover the base device pads 1232 and the base interconnect pads 1234.

The base encapsulation 1236 can include a step portion 1242, which is adjacent and within a periphery of the base encapsulation 1236, aligned over the base vertical interconnects 1228. The base encapsulation 1236 can partially expose the base interconnect pads 1234 at the step portion 1242.

Top surfaces of the base interconnect pads 1234 can be exposed from the base encapsulation 1236 at the step portion 1242. Planes of the top surfaces of the base interconnect pads 1234 can be coplanar with a plane of a top surface of the step portion 1242.

The base encapsulation 1236 can include a recess 1244, which is an indentation at a central portion of the base encapsulation 1236, aligned over the base integrated circuit 1220. The base encapsulation 1236 can partially expose the base device pads 1232 within the recess 1244.

Top surfaces of the base device pads 1232 can be exposed from the base encapsulation 1236 within the recess 1244. Planes of the top surfaces of the base device pads 1232 can be coplanar with a plane of a top surface of the base encapsulation 1236 within the recess 1244.

The recess 1244 can be bounded by non-horizontal inner sides of the step portion 1242. The top surface of the base encapsulation 1236 within the recess 1244 can be lower than the top surface of the step portion 1242.

The base package 1202 can include base external interconnects 1246. The base external interconnects 1246 can be formed in a manner similar to the base external interconnects 146 of FIG. 1.

The base vertical interconnects 1228 and the base interconnect pads 1234 can include a combined height that is greater than a combined height of the base attach layer 1218, the base integrated circuit 1220, the base device connectors 1226, and the base device pads 1232. In other words, a distance from the base substrate top side 1208 to top surfaces of the base interconnect pads 1234 can be greater than a distance from the base substrate top side 1208 to top surfaces of the base device pads 1232.

The base vertical interconnects 1228 can include a height that can be greater than a combined height of the base attach layer 1218, the base integrated circuit 1220, the base device connectors 1226, and the base device pads 1232. In other words, a distance from the base substrate top side 1208 to top ends of the base vertical interconnects 1228 can be greater than a distance from the base substrate top side 1208 to top surfaces of the base device pads 1232.

It has been discovered that the base device pads 1232 and the base interconnect pads 1234 significantly enhance joint strength between top and bottom solder bumps in a package structure with the base encapsulation 1236 having the step portion 1242 and the recess 1244.

Figure 13:
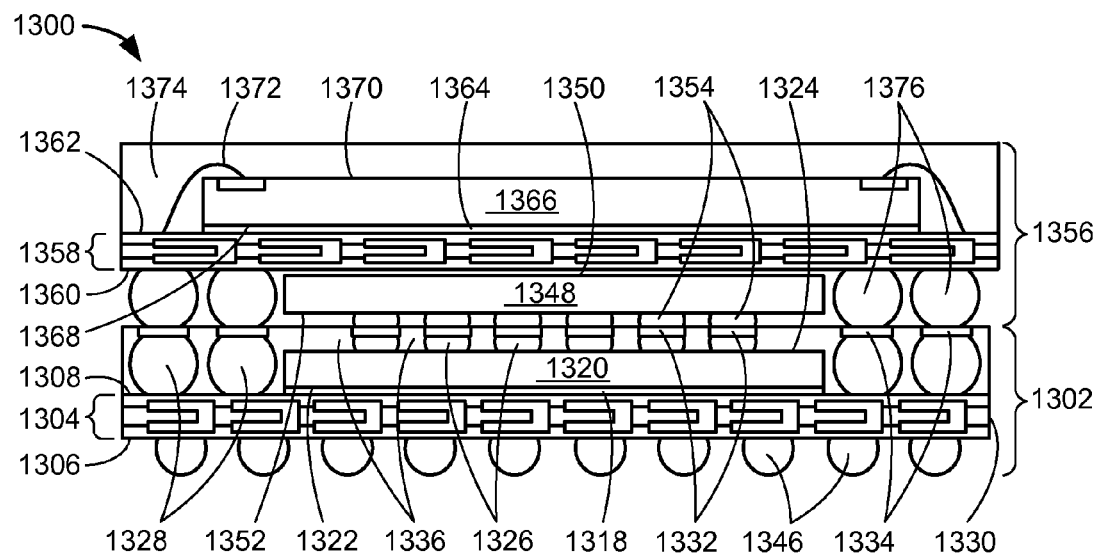
FIG. 13 is a cross-sectional view of an integrated circuit packaging system in a fifth embodiment of the present invention.

Referring now to FIG. 13, therein is shown a cross-sectional view of an integrated circuit packaging system 1300 in a fifth embodiment of the present invention. The integrated circuit packaging system 1300 can include a stack application. The integrated circuit packaging system 1300 can be formed in a manner similar to the integrated circuit packaging system 100 of FIG. 1, except for additions of a semiconductor device, connectors, and a semiconductor package.

The integrated circuit packaging system 1300 can include a base package 1302. The base package 1302 can include a base package substrate 1304 having a base substrate bottom side 1306 and a base substrate top side 1308. The base package substrate 1304 can be formed in a manner similar to the base package substrate 104 of FIG. 1.

The base package 1302 can include a base attach layer 1318 and a base integrated circuit 1320. The base integrated circuit 1320 can include a base device inactive side 1322 and a base device active side 1324. The base attach layer 1318 and the base integrated circuit 1320 can be formed in a manner similar to the base attach layer 118 of FIG. 1 and the base integrated circuit 120 of FIG. 1, respectively.

The base package 1302 can include base device connectors 1326 and base vertical interconnects 1328. The base device connectors 1326 and the base vertical interconnects 1328 can be formed in a manner similar to the base device connectors 126 of FIG. 1 and the base vertical interconnects 128 of FIG. 1, respectively.

The base package substrate 1304 can include a base substrate periphery 1330. The base package substrate 1304 can be formed in a manner similar to the base package substrate 104.

The base package 1302 can include base device pads 1332 and base interconnect pads 1334. The base device pads 1332 and the base interconnect pads 1334 can be formed in a manner similar to the base device pads 132 of FIG. 1 and the base interconnect pads 134 of FIG. 1, respectively.

The base package 1302 can include a base encapsulation 1336 and base external interconnects 1346. The base encapsulation 1336 and the base external interconnects 1346 can be formed in a manner similar to the base encapsulation 136 of FIG. 1 and the base external interconnects 146 of FIG. 1, respectively.

The integrated circuit packaging system 1300 can include a stack component 1348 mounted over a central portion of the base package 1302. The stack component 1348 is a semiconductor device including a flip chip or an integrated circuit die.

The stack component 1348 can include a stack component inactive side 1350 and a stack component active side 1352 opposite the stack component inactive side 1350. The stack component 1348 can be mounted over the base package 1302 with the stack component active side 1352 facing the base package 1302. For illustrative purposes, the stack component 1348 is shown as a flip chip, although it is understood that the stack component 1348 can be any semiconductor device.

The integrated circuit packaging system 1300 can include stack component connectors 1354 connected to the base device pads 1332 and the stack component active side 1352. The stack component connectors 1354 provide electrical connectivity between the base device pads 1332 and the stack component 1348. For illustrative purposes, the stack component connectors 1354 are shown as conductive bumps, although it is understood that the stack component connectors 1354 can be any other electrical connectors.

The integrated circuit packaging system 1300 can include a stack package 1356, which is a semiconductor package. The stack package 1356 can include a stack package substrate 1358, which is a support structure for mounting and electrically connecting a semiconductor device thereto.

The stack package substrate 1358 can include a stack substrate bottom side 1360 and a stack substrate top side 1362 opposite the stack substrate bottom side 1360. The stack package substrate 1358 can be electrically connected between the stack substrate bottom side 1360 and the stack substrate top side 1362.

The stack package 1356 can include a stack attach layer 1364 attached to a stack integrated circuit 1366 and the stack substrate top side 1362. The stack attach layer 1364 can include an attach material including a die attach material, an adhesive, or an epoxy. The stack integrated circuit 1366 is a semiconductor device including a semiconductor chip, a wirebond die, or an integrated circuit die. For illustrative purposes, the stack integrated circuit 1366 is shown as a wirebond die, although it is understood that the stack integrated circuit 1366 can be any semiconductor device.

The stack integrated circuit 1366 can be mounted over a central portion of the stack substrate top side 1362. The stack integrated circuit 1366 can include a stack device inactive side 1368 and a stack device active side 1370 opposite the stack device inactive side 1368. The stack device inactive side 1368 can be attached to the stack substrate top side 1362 with the stack attach layer 1364.

The stack package 1356 can include stack device connectors 1372 connected to a peripheral portion of the stack package substrate 1358 at the stack substrate top side 1362 and a peripheral portion of the stack integrated circuit 1366 at the stack device active side 1370. The stack device connectors 1372 provide electrical connectivity between the stack package substrate 1358 and the stack integrated circuit 1366. For illustrative purposes, the stack device connectors 1372 are shown as bond wires, although it is understood that the stack device connectors 1372 can be any other electrical connectors.

The stack package 1356 can include a stack encapsulation 1374, which covers a semiconductor package to seal electrical devices providing mechanical and environmental protection. The stack encapsulation 1374 can be formed over the stack substrate top side 1362. The stack encapsulation 1374 can cover the stack attach layer 1364, the stack integrated circuit 1366, and the stack device connectors 1372.

The stack package 1356 can include stack external interconnects 1376 attached to the peripheral portion of the stack package substrate 1358 at the stack substrate bottom side 1360. The stack external interconnects 1376 are electrical connectors that provide electrical connectivity between the stack package 1356 and another semiconductor package.

The stack package 1356 can be mounted over the base package 1302 and the stack component 1348. The stack package 1356 can be mounted with a central portion of the stack package substrate 1358 at the stack substrate bottom side 1360 over the stack component 1348 and with the stack external interconnects 1376 connected to the base interconnect pads 1334.

The stack external interconnects 1376 can be adjacent non-horizontal sides of the stack component 1348. Heights of the stack external interconnects 1376 define spacing between the base package 1302 and the stack package 1356. The heights of the stack external interconnects 1376 can be greater than a combined height of the stack component 1348 and the stack component connectors 1354.

It has been discovered that the base device pads 1332 and the base interconnect pads 1334 significantly improve warpage to mount the stack component 1348 and the stack package 1356 over the base package 1302.

Figure 14:
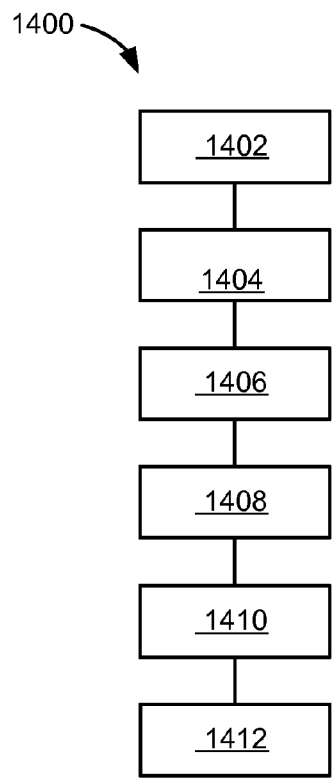
FIG. 14 is a flow chart of a method of manufacture of an integrated circuit packaging system in a further embodiment of the present invention.

Referring now to FIG. 14, therein is shown a flow chart of a method 1400 of manufacture of the integrated circuit packaging system 100 in a further embodiment of the present invention. The method 1400 includes: forming a connection carrier having base device pads and base interconnect pads on a carrier top side of the connection carrier in a block 1402; connecting a base integrated circuit to the base device pads and mounted over the carrier top side in a block 1404; mounting base vertical interconnects directly on the base interconnect pads in a block 1406; attaching a base package substrate to the base integrated circuit and directly on the base vertical interconnects in a block 1408; forming a base encapsulation on the base package substrate, the base device pads, and the base interconnect pads in a block 1410; and removing a portion of the connection carrier with the base device pads and the base interconnect pads partially exposed opposite the base package substrate in a block 1412.

Thus, it has been discovered that the integrated circuit packaging system of the present invention furnishes important and heretofore unknown and unavailable solutions, capabilities, and functional aspects for stacking integrated circuit packages. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   base device pads having device pad surfaces coplanar to each other characteristic of being formed on a carrier top side of a connection carrier;
   base interconnected pads having interconnect pad surfaces coplanar to each other characteristic of being formed on the carrier top side;
   a base integrated circuit connected to the base device pads;
   base vertical interconnects directly on the base interconnect pads;
   a base package substrate attached to the base integrated circuit and directly on the base vertical interconnects;
   a base encapsulation on the base package substrate, the base device pads, and the base interconnect pads, the base encapsulation partially exposing the base device pads and the base interconnect pads opposite the base package substrate; and
   base external interconnects attached to a base substrate bottom side of the base package substrate, wherein the base encapsulation includes a step portion over the base integrated circuit, the base encapsulation partially exposing the base device pads at the step portion.

2. The system as claimed in claim 1 further comprising base device connectors connected to the base integrated circuit and the base device pads.

3. The system as claimed in claim 1 further comprising conductive traces connected to the base device pads and the base interconnect pads.

4. The system as claimed in claim 1 wherein the base interconnect pads surround the base device pads.

5. The system as claimed in claim 1 wherein the base encapsulation includes an external planar surface of the base encapsulation coplanar with device pad surfaces of the base device pads and interconnect pad surfaces of the base interconnect pads.

6. The system as claimed in claim 1 further comprising a base component connected to the base package substrate and attached to the base integrated circuit.

7. An integrated circuit packaging system comprising:
   base device pads having device pad surfaces coplanar to each other characteristic of being formed on a carrier top side of a connection carrier;

base interconnect pads having interconnect pad surfaces coplanar to each other characteristic of being formed on the carrier top side;

a base integrated circuit connected to the base device pads;

base vertical interconnects mounted directly on the base interconnect pads;

a base package substrate attached to the base integrated circuit and directly on the base vertical interconnects;

a base encapsulation on the base package substrate, the base device pads, and the base interconnect pads, the base encapsulation partially exposing the base device pads and the base interconnect pads opposite the base package substrate; and base external interconnects attached to a base substrate bottom side of the base package substrate, wherein the base encapsulation includes a recess over the base integrated circuit, the base encapsulation partially exposing the base device pads within the recess.

8. The system as claimed in claim 1 further comprising a stack component connected to the base device pads.

9. The system as claimed in claim 7 further comprising base device connectors connected to the base integrated circuit and the base device pads.

10. The system as claimed in claim 7 further comprising conductive traces connected to the base device pads and the base interconnect pads.

11. The system as claimed in claim 7 wherein the base interconnect pads surround the base device pads.

12. The system as claimed in claim 7 wherein the base encapsulation includes an external planar surface of the base encapsulation coplanar with device pad surfaces of the base device pads and interconnect pad surfaces of the base interconnect pads.

13. The system as claimed in claim 7 further comprising a base component connected to the base package substrate and attached to the base integrated circuit.

14. The system as claimed in claim 7 further comprising a stack component connected to the base device pads.

* * * * *

UNITED STATES PATENT AND TRADEMARK OFFICE
CERTIFICATE OF CORRECTION

| | |
|---|---|
| PATENT NO. | : 8,466,567 B2 |
| APPLICATION NO. | : 12/884134 |
| DATED | : June 18, 2013 |
| INVENTOR(S) | : Choi et al. |

Page 1 of 1

It is certified that error appears in the above-identified patent and that said Letters Patent is hereby corrected as shown below:

In the Claims:

Column 16, claim 1, line 30, delete "base interconnected", and insert therefor --base interconnect--

Column 16, claim 1, line 34, delete "interconnects directly", and insert therefor --interconnects mounted directly--

Signed and Sealed this
Third Day of November, 2015

Michelle K. Lee
*Director of the United States Patent and Trademark Office*